(12) United States Patent
Sugai

(10) Patent No.: US 8,451,616 B2
(45) Date of Patent: May 28, 2013

(54) ELECTRONIC APPARATUS

(75) Inventor: Takahiro Sugai, Kokubunji (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/093,650

(22) Filed: Apr. 25, 2011

(65) Prior Publication Data

US 2012/0057279 A1  Mar. 8, 2012

(30) Foreign Application Priority Data

Sep. 3, 2010  (JP) .................................. 2010-198059

(51) Int. Cl.
  H05K 7/02 (2006.01)
  H05K 7/06 (2006.01)
  H05K 7/08 (2006.01)
  H05K 7/10 (2006.01)

(52) U.S. Cl.
  USPC ........... 361/760; 361/763; 361/764; 361/807; 361/810

(58) Field of Classification Search
  USPC ..................... 361/679.01, 807–810, 814, 752
  See application file for complete search history.

(56) References Cited

U.S. PATENT DOCUMENTS

| 4,330,163 | A | * | 5/1982 | Aikens et al. ................... 439/71 |
| 5,061,192 | A | * | 10/1991 | Chapin et al. ................... 439/66 |
| 6,799,979 | B1 | * | 10/2004 | Huang ............................. 439/74 |
| 6,975,518 | B2 | * | 12/2005 | Frutschy et al. ............. 361/769 |
| 2002/0047749 | A1 | | 4/2002 | Sugawara |

FOREIGN PATENT DOCUMENTS

| JP | 02222599 | 9/1990 |
| JP | 2002-134873 | 5/2002 |
| JP | 2002-353595 | 12/2002 |
| JP | 2003-060365 | 2/2003 |
| JP | 2004-342766 | 12/2004 |

OTHER PUBLICATIONS

Japanese Patent Application No. 2010-198059; Notice of Reasons for Rejection; Mailed Aug. 2, 2011 (English translation).

* cited by examiner

Primary Examiner — Tuan T Dinh

(74) Attorney, Agent, or Firm — Blakely, Sokoloff, Taylor & Zafman LLP

(57) ABSTRACT

According to one embodiment, an electronic apparatus includes a housing, a wiring pattern, a recess, a pad portion, and an electronic component. The wiring pattern is formed on an inner surface of the housing from an electrically conductive adhesive. The recess is in the inner surface of the housing. The pad portion is formed in the recess from the conductive adhesive and connected to an end portion of the wiring pattern. The electronic component includes a terminal which contacts the pad portion.

14 Claims, 11 Drawing Sheets

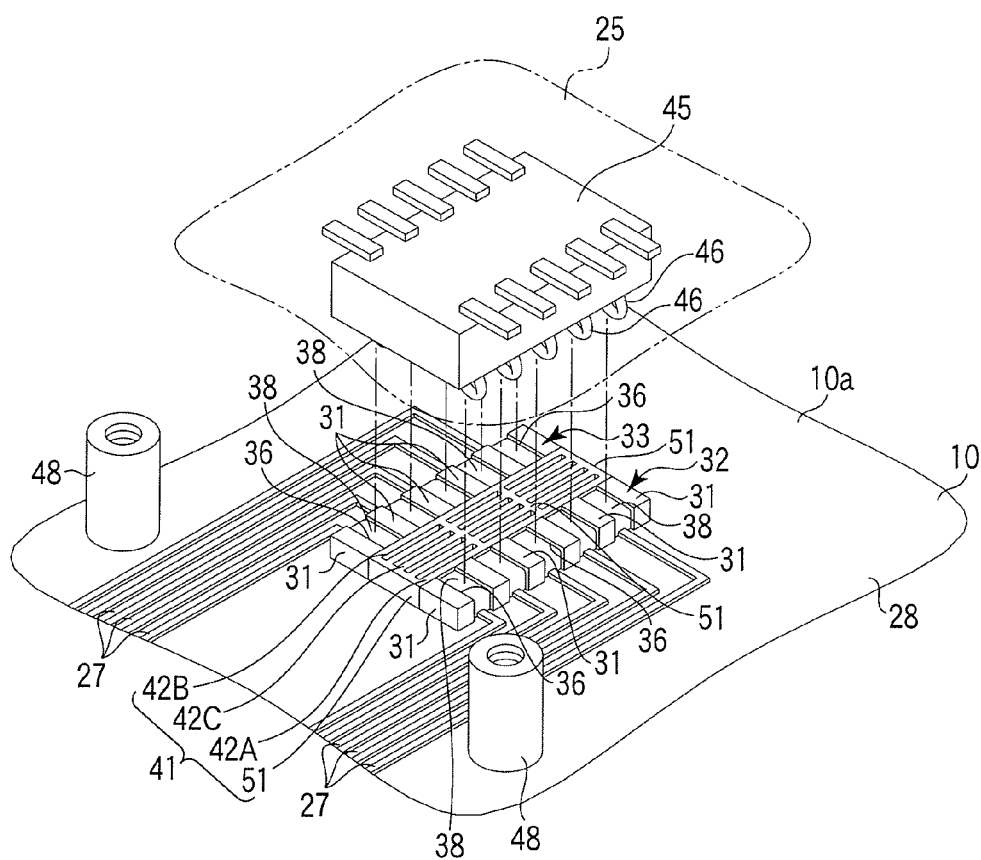
F I G. 5

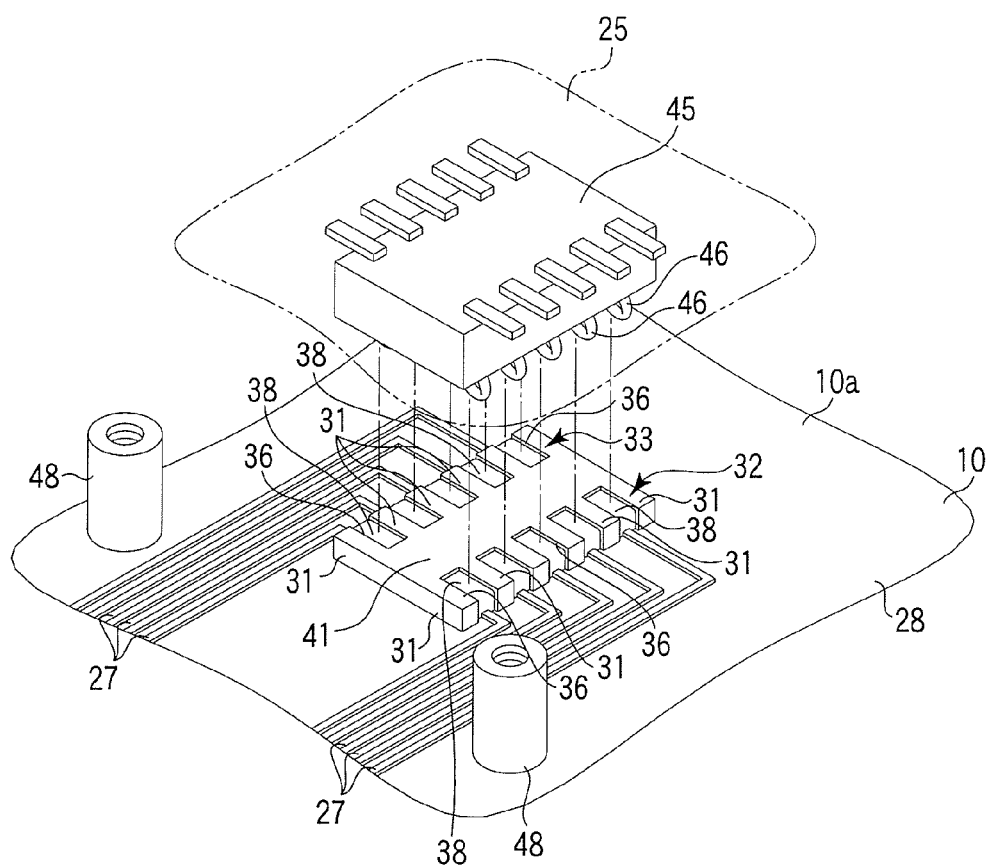
F I G. 7

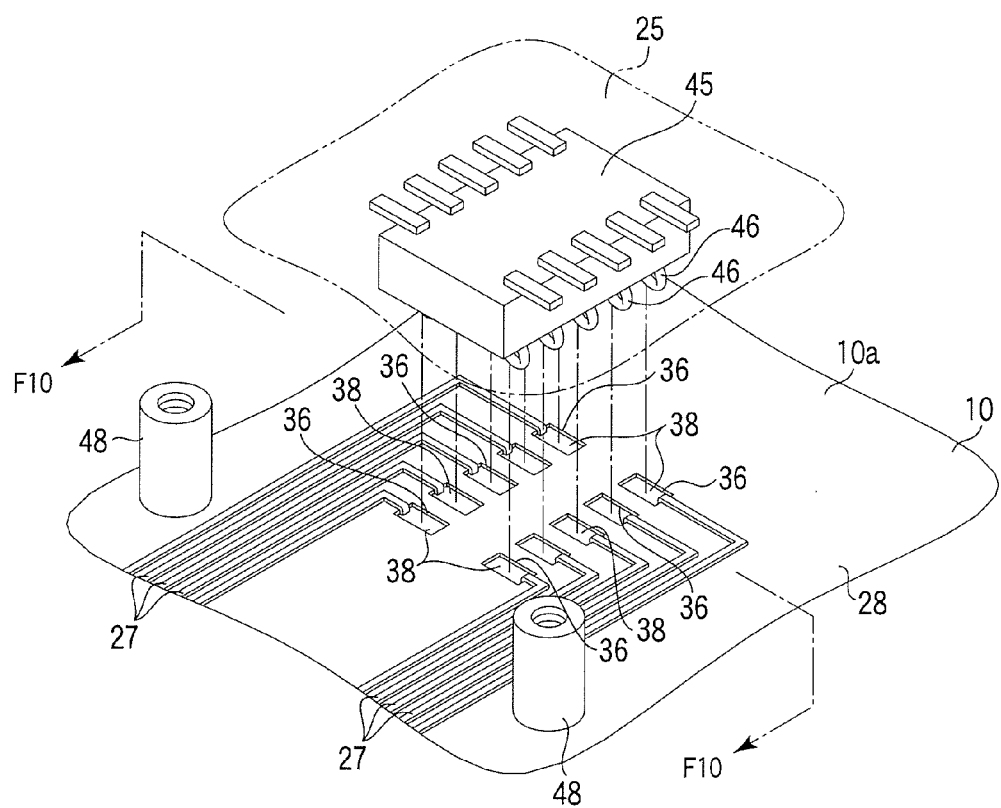
F I G. 9

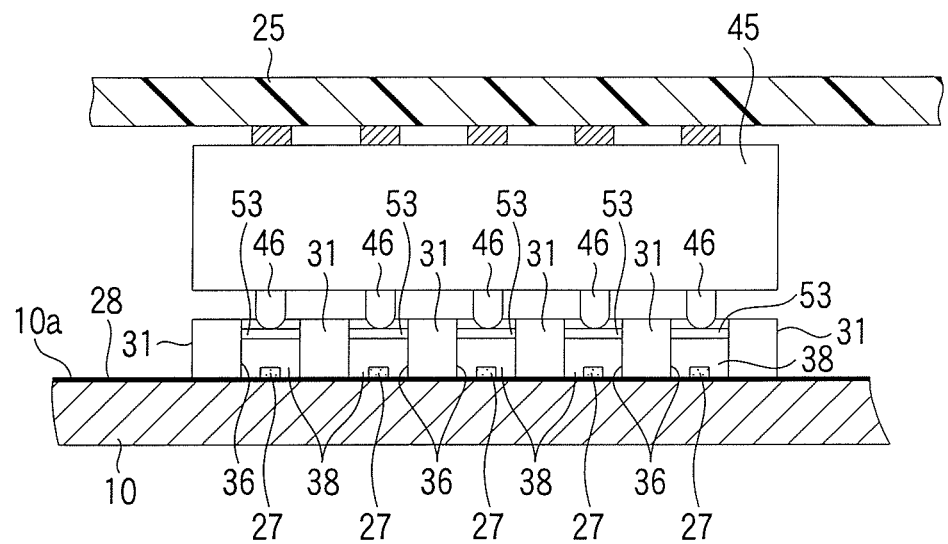
F I G. 11
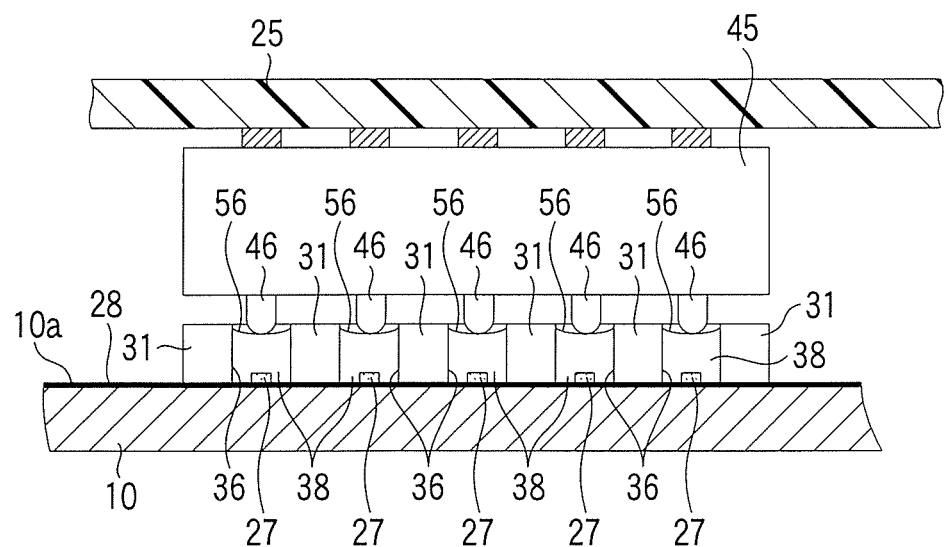
F I G. 12

ELECTRONIC APPARATUS

CROSS-REFERENCE TO RELATED APPLICATIONS

This application is based upon and claims the benefit of priority from Japanese Patent Application No. 2010-198059, filed Sep. 3, 2010; the entire contents of which are incorporated herein by reference.

FIELD

Embodiments described herein relate generally to an electronic apparatus.

BACKGROUND

An electrically conductive adhesive for connecting a substrate and electronic component is used in an electronic apparatus, such as a portable computer. For example, an epoxy adhesive containing a silver filler is used as a conductive adhesive of this kind.

Wiring patterns are formed on the inner surface of a housing by printing the conductive adhesive on the inner surface. The conductive adhesive is also used to form pads that serve for mounting the electronic component or connecting a connector of a printed circuit board.

The conductive adhesive pads require more adhesive than wiring pattern. Therefore, the adhesive that forms the pads may flow if its viscosity is low or if the pads are pressurized by the connector.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 5 is an exemplary exploded perspective view showing the internal structure of a portable computer according to a second embodiment;

FIG. 7 is an exemplary exploded perspective view showing the internal structure of a portable computer according to a fourth embodiment;

FIG. 9 is an exemplary exploded perspective view showing the internal structure of a portable computer according to a sixth embodiment;

FIG. 11 is an exemplary sectional view showing the internal structure of a portable computer according to a seventh embodiment; and FIG. 12 is an exemplary sectional view showing the internal structure of a portable computer according to an eighth embodiment.

DETAILED DESCRIPTION

Various embodiments will be described hereinafter with reference to the accompanying drawings.

In general, according to one embodiment, an electronic apparatus includes a housing, a wiring pattern, a recess, a pad portion, and an electronic component. The wiring pattern is formed on an inner surface of the housing from an electrically conductive adhesive. The recess is in the inner surface of the housing. The pad portion is formed in the recess from the conductive adhesive and connected to an end portion of the wiring pattern. The electronic component includes a terminal which contacts the pad portion.

A first embodiment will now be described with reference to FIGS. 1 to 4. In this specification, the user side is defined as forward; the far side from the user as rearward, the user's left-hand side as leftward, the user's right-hand side as rightward, the upper side with respect to the user as upward, and the lower side with respect to the user as downward.

Figure 1:
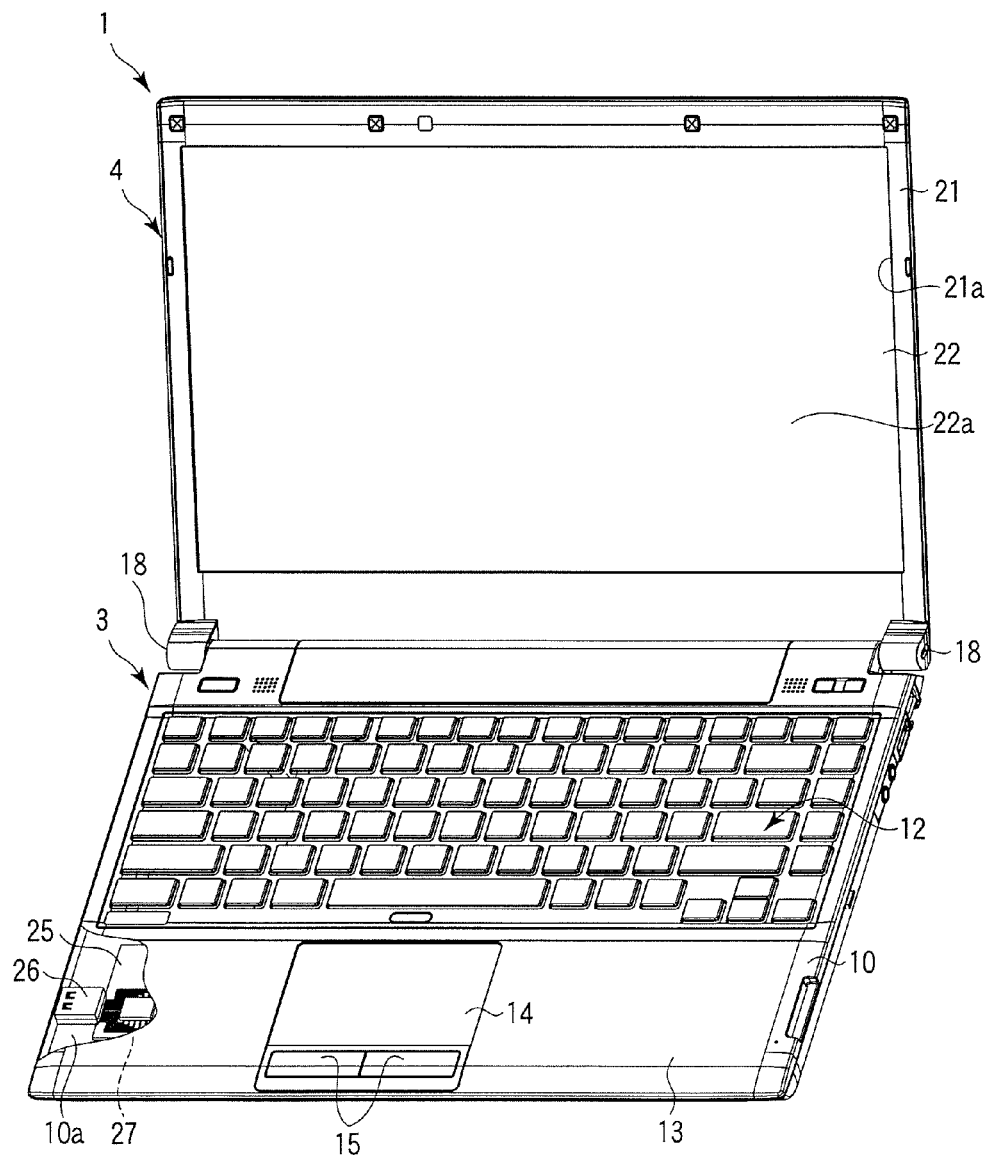
FIG. 1 is an exemplary perspective view showing a portable computer according to a first embodiment.

FIG. 1 is an exemplary perspective view showing a portable computer 1 according to the first embodiment. The portable computer 1 is an example of the electronic apparatus. As shown in FIG. 1, the computer 1 comprises a main unit 3 and display unit 4.

The main unit 3 comprises a flat box-like housing 10, which is formed of magnesium alloy. Alternatively, the housing 10 may be formed of a resin, for example. A keyboard 12, palmrest 13, touchpad 14, and a pair of buttons 15 are arranged on the upper surface of the housing 10.

As shown in FIG. 1, a pair of hinges 18 connect the display unit 4 and main unit 3. The hinges 18 are individually arranged at the rear end of the housing 10.

The display unit 4 is pivotable around the hinges 18 between closed and open positions. In the closed position, the display unit 4 lies on the main unit 3. In the open position, the display unit 4 rises from the rear end of the main unit 3.

The display unit 4 comprises a flat box-like display housing 21 and display module 22. The display module 22 is, for example, a liquid crystal display contained in the display housing 21.

A display aperture 21a is formed in the front surface of the display housing 21. A screen 22a of the display module 22 is exposed to the outside of the display unit 4 through the display aperture 21a.

The main unit 3 comprises a substrate 25, USB connector 26, and wiring patterns 27. The substrate 25 is, for example, a rigid printed circuit board. The USB connector 26 is attached to an inner surface 10a of the housing 10 and exposed to the outside through an aperture in a side surface of the housing 10. The USB connector 26 is electrically connected to the substrate 25 through the wiring patterns 27.

Figure 2:
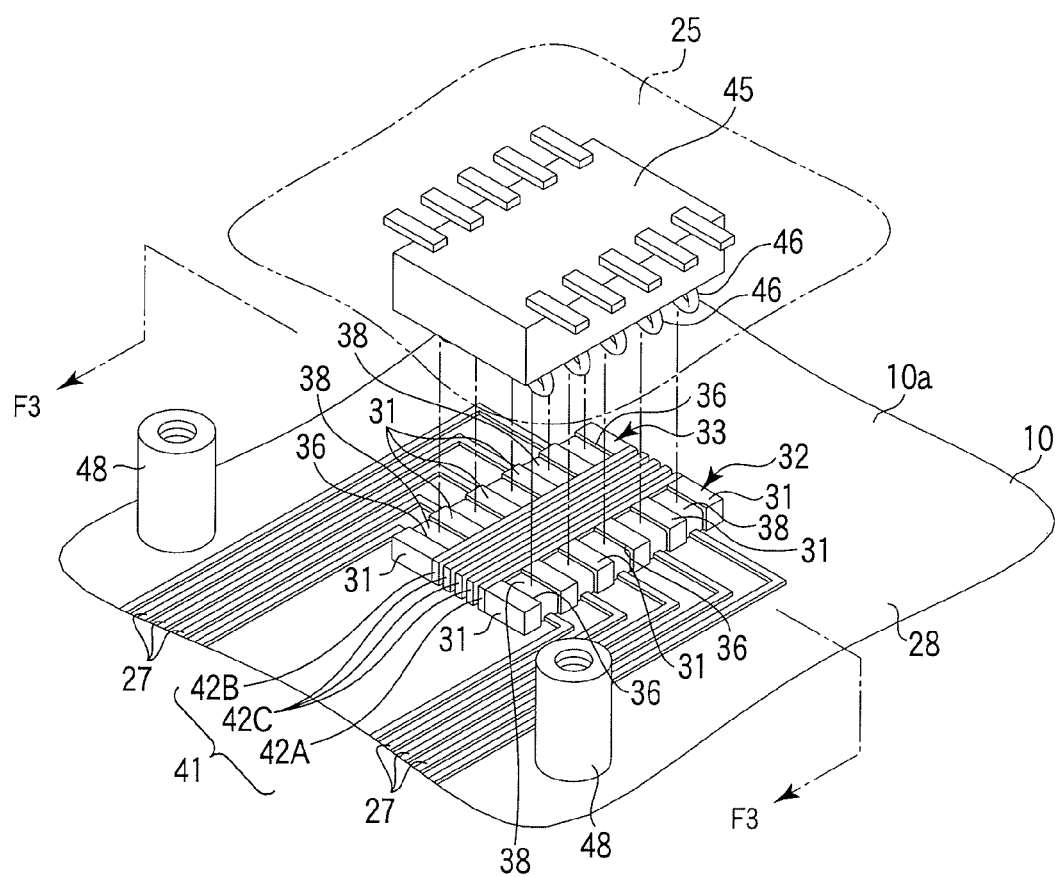
FIG. 2 is an exemplary exploded perspective view showing the internal structure of the portable computer of the first embodiment.
Figure 3:
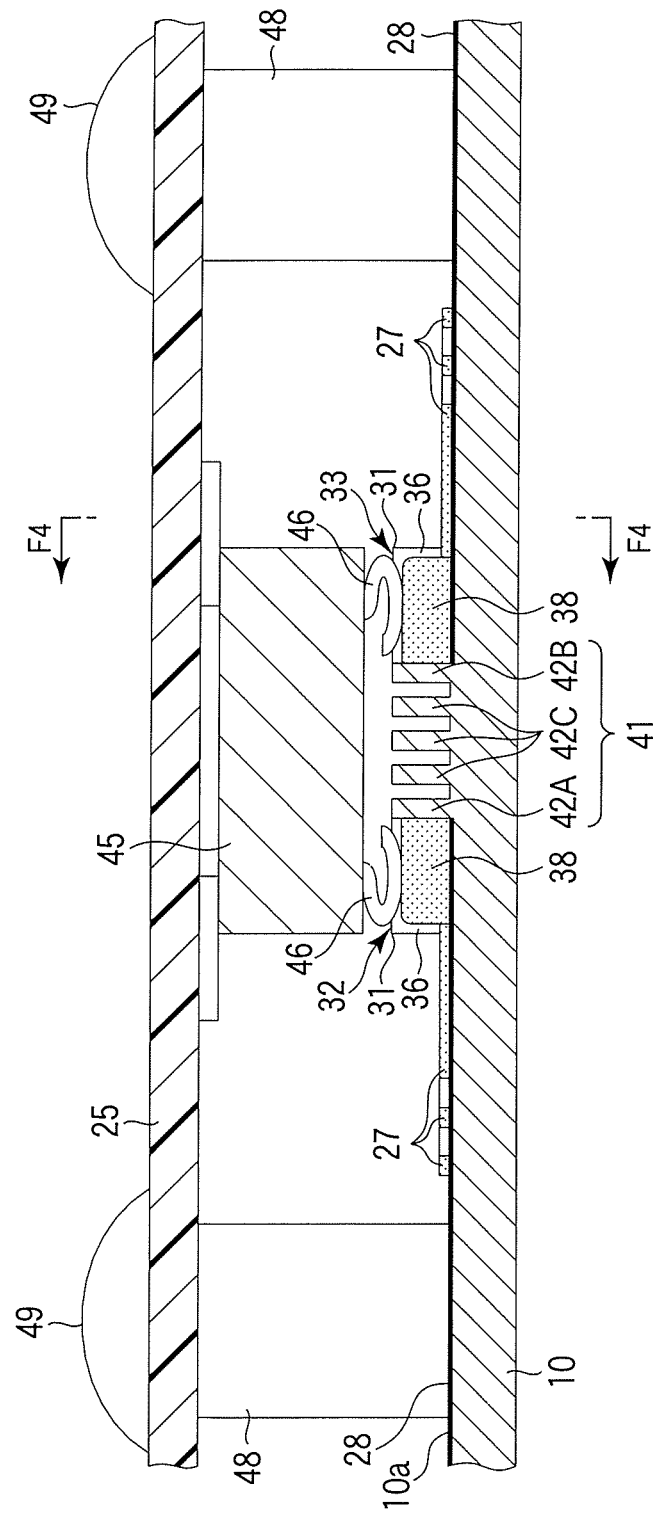
FIG. 3 is an exemplary sectional view of the portable computer of the first embodiment taken along line F3-F3 of FIG. 2.
Figure 4:
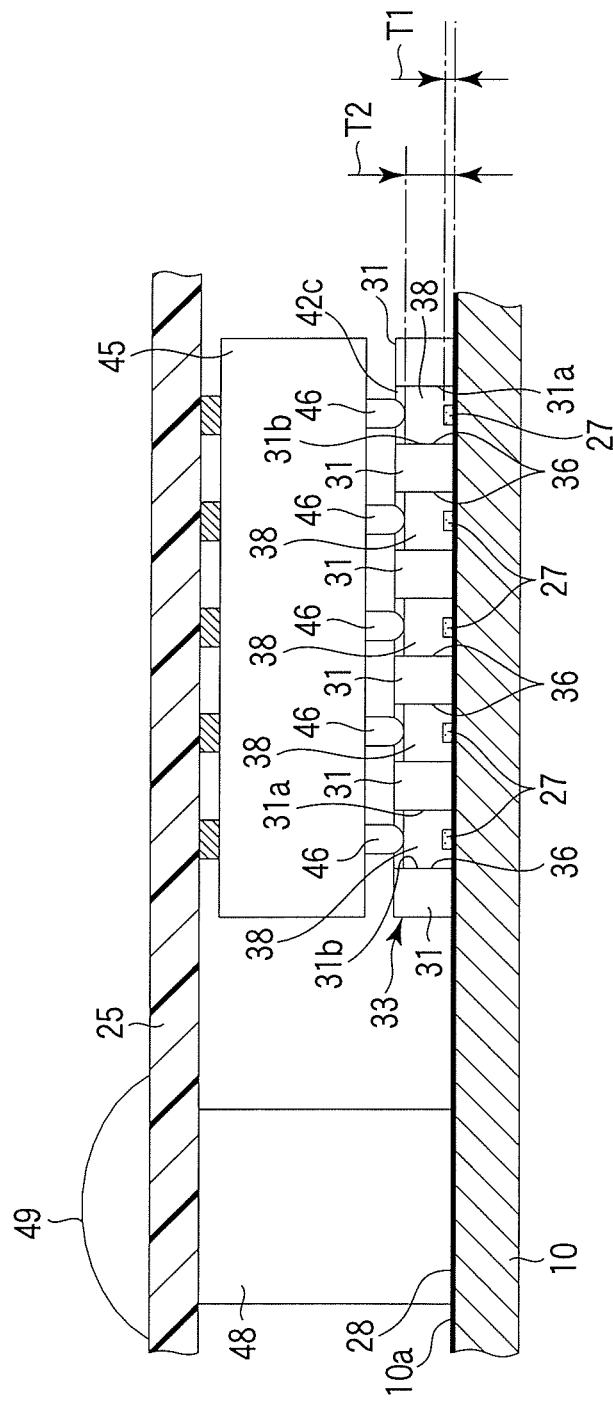
FIG. 4 is an exemplary sectional view of the portable computer of the first embodiment taken along line F4-F4 of FIG. 3.

FIG. 2 is an exemplary exploded perspective view showing the internal structure of the portable computer 1. FIG. 3 is an exemplary sectional view of the portable computer 1 taken along line F3-F3 of FIG. 2. FIG. 4 is an exemplary sectional view of the portable computer 1 taken along line F4-F4 of FIG. 3.

As shown in FIG. 2, the wiring patterns 27 are formed on the inner surface 10a of the housing 10 by printing an electrically conductive adhesive on the inner surface 10a. The conductive adhesive may be linearly applied by means of, for example, a dispenser instead of being printed. As shown in FIG. 3, the inner surface 10a of the housing 10 is covered by an insulating film 28. Thus, the wiring patterns 27 and housing 10 are electrically insulated.

The conductive adhesive that is used to form the wiring patterns 27 may be a thermosetting epoxy adhesive containing a silver filler. The conductive adhesive is not limited to this and may be another adhesive containing, for example, a copper filler or carbon fibers.

As shown in FIG. 4, a plurality of projections 31 are arranged on the inner surface 10a of the housing 10. The projections 31 are formed integrally with the housing 10 and project with a height greater than thickness T1 of the wiring patterns 27. As shown in FIG. 2, the projections 31 are arranged in two rows, first and second projection rows 32 and 33. The first projection row 32 includes some of the projections 31 arranged in one row. The second projection row 33 includes the remaining projections 31 arranged in another row and extends parallel to the first projection row 32.

As shown in FIG. 4, a plurality of recesses 36 are provided between the projections 31, individually. Each recess 36 is defined by a side surface 31a of one projection 31, a side surface 31b of another projection 31, and the inner surface 10a of the housing 10. The side surface 31a of the one projection 31 and the side surface 31b of the other projection 31 face each other. As shown in FIG. 2, the recesses 36 are arranged in two rows.

A plurality of pad portions 38 are disposed in the recesses 36, individually. The pad portions 38 are formed by filling the recesses 36 with a conductive adhesive by printing. The conductive adhesive may be applied by means of, for example, a dispenser instead of being printed.

As shown in FIG. 4, thickness T2 of the pad portions 38 is greater than thickness T1 of the wiring patterns 27. The pad portions 38 are contained in their corresponding recesses 36.

The pad portions 38, like the wiring patterns 27, are formed from the thermosetting epoxy adhesive containing the silver filler. The conductive adhesive of the pad portions 38 is not limited to this and may be an adhesive different from that of the wiring patterns 27.

As shown in FIG. 3, the pad portions 38 are connected individually into respective one ends of the wiring patterns 27. The other end portions of the wiring patterns 27 are individually connected to the USB connector 26. Thus, pad portions 38 are electrically connected to the USB connector 26 through the wiring patterns 27.

As shown in FIG. 2, a reinforcement portion 41 is provided on the inner surface 10a of the housing 10. The reinforcement portion 41 adjoins the pad portions 38 and is located between the first and second projection rows 32 and 33.

The reinforcement portion 41 comprises a plurality of first ribs 42A, 42B and 42C. The first ribs 42A, 42B and 42C are formed integrally with the housing 10 and protrude from its inner surface 10a. The first ribs 42A, 42B and 42C individually extend along the array of the projections 31. In other words, the first ribs 42A, 42B and 42C extend parallel to the first and second projection rows 32 and 33.

The first rib 42A is in contact with the projections 31 in the first projection row 32. The first rib 42B is in contact with the projections 31 in the second projection row 33. The first ribs 42C are individually arranged between the first ribs 42A and 42B.

The first rib 42A defines the recesses 36 in conjunction with the projections 31 in the first projection row 32. The first rib 42B defines the recesses 36 in conjunction with the projections 31 in the second projection row 33.

As shown in FIG. 3, the substrate 25 faces the inner surface 10a of the housing 10. A compression connector 45 is mounted on the substrate 25. The compression connector 45 is an example of the electronic component.

The compression connector 45 faces the inner surface 10a of the housing 10. The compression connector 45 comprises a plurality of terminals 46. The terminals 46 have elasticity and are located in positions corresponding to the pad portions 38, individually. The terminals 46 project toward the pad portions 38, individually.

A plurality of bosses 48 protrude from the inner surface 10a of the housing 10. The substrate 25 is secured to the bosses 48 by screws 49. Thus, the terminals 46 of the compression connector 45 contact the pad portions 38. The terminals 46 are elastically deformable and configured to press the pad portions 38, individually.

According to the portable computer 1 constructed in this manner, the pad portions 38 are disposed in the recesses 36, individually. The recesses 36 are divided from one another by the projections 31. Therefore, dislocation during the formation of the pad portions 38, short-circuiting between the pad portions 38, and migration is prevented. Thus, failure of the pad portions 38 is prevented.

The recesses 36 are defined individually by the projections 31 that protrude from the inner surface 10a of the housing 10. Even if the housing 10 is thin or low-profile, therefore, it is easily provided with the recesses 36.

Thickness T2 of the pad portions 38 is greater than thickness T1 of the wiring patterns 27. In other words, the pad portions 38 are high-profile. Therefore, the pad portions 38 remain undamaged even if they are worn to a certain degree by the terminals 46 of the compression connector 45. Thus, failure of the pad portions 38 is prevented.

The terminals 46 of the compression connector 45 urge the pad portions 38 to press the housing 10. Since the reinforcement portion 41 is disposed near the pad portions 38, the housing 10 is improved in rigidity, so that it is prevented from being deformed by a force received from the terminals 46. Thus, contact failure between the pad portions 38 and terminals 46 attributable to deformation of the housing 10 is prevented. Since the rigidity of the housing 10 is improved, moreover, the housing 10 is made thinner.

A second embodiment will now be described with reference to FIG. 5. Like reference numbers are used to designate those constituent parts which have the same functions as their counterparts in the portable computer 1 of the first embodiment, and a description of those parts is omitted.

FIG. 5 is an exemplary exploded perspective view showing the internal structure of a portable computer 1 of the second embodiment. As shown in FIG. 5, a reinforcement portion 41 comprises a plurality of second ribs 51. The second ribs 51 are formed integrally with a housing 10 and protrude from an inner surface 10a of the housing 10. The second ribs 51 individually extend at right angles to a plurality of first ribs 42A, 42B and 42C. Thus, the housing 10 is improved in rigidity, so that it is prevented from deforming.

A third embodiment will now be described with reference to FIG. 6. Like reference numbers are used to designate those constituent parts which have the same functions as their counterparts in the portable computer 1 of the first embodiment, and a description of those parts is omitted.

Figure 6:
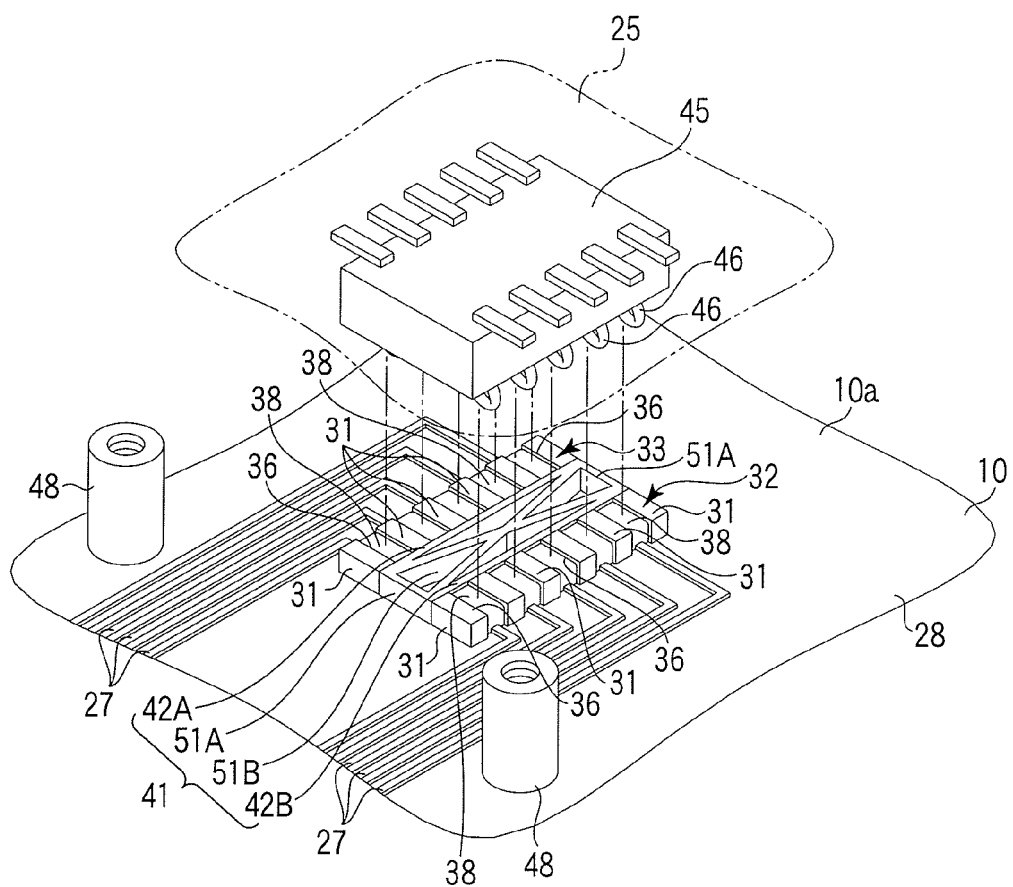
FIG. 6 is an exemplary exploded perspective view showing the internal structure of a portable computer according to a third embodiment.

FIG. 6 is an exemplary exploded perspective view showing the internal structure of a portable computer 1 of the third embodiment. As shown in FIG. 6, a reinforcement portion 41 comprises a plurality of second ribs 51A and 51B. The second ribs 51A and 51B are formed integrally with a housing 10 and protrude from an inner surface 10a of the housing 10.

The second ribs 51A individually extend at right angles to a plurality of first ribs 42A and 42B. The second ribs 51B cross the first ribs 42A and 42B and extend across each other. Thus, the housing 10 is improved in rigidity, so that it is prevented from deforming.

A fourth embodiment will now be described with reference to FIG. 7. Like reference numbers are used to designate those constituent parts which have the same functions as their counterparts in the portable computer 1 of the first embodiment, and a description of those parts is omitted.

FIG. 7 is an exemplary exploded perspective view showing the internal structure of a portable computer 1 of the fourth embodiment. As shown in FIG. 7, a reinforcement portion 41 protrudes from an inner surface 10a of a housing 10. The reinforcement portion 41 is formed integrally with the housing 10 and a plurality of projections 31. The reinforcement portion 41 spans between the first and second projection rows 32 and 33. Thus, the housing 10 is improved in rigidity, so that it is prevented from deforming. Further, the reinforcement portion 41 is easily formed.

A fifth embodiment will now be described with reference to FIG. 8. Like reference numbers are used to designate those constituent parts which have the same functions as their counterparts in the portable computer 1 of the first embodiment, and a description of those parts is omitted.

Figure 8:
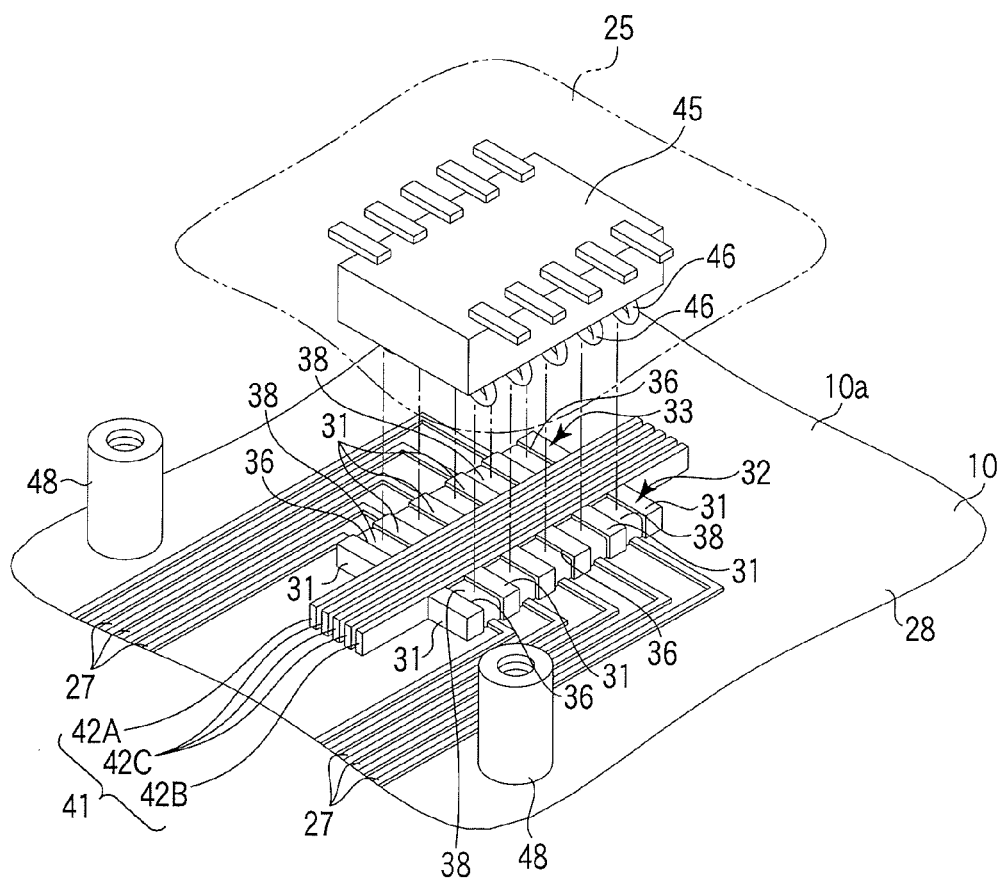
FIG. 8 is an exemplary exploded perspective view showing the internal structure of a portable computer according to a fifth embodiment.

FIG. 8 is an exemplary exploded perspective view showing the internal structure of a portable computer 1 of the fifth embodiment. As shown in FIG. 8, first ribs 42A, 42B and 42C extend longer than a first projection row 32. Thus, a housing 10 is improved in rigidity, so that it is prevented from deforming.

A sixth embodiment will now be described with reference to FIGS. 9 and 10. Like reference numbers are used to designate those constituent parts which have the same functions as their counterparts in the portable computer 1 of the first embodiment, and a description of those parts is omitted.

Figure 10:
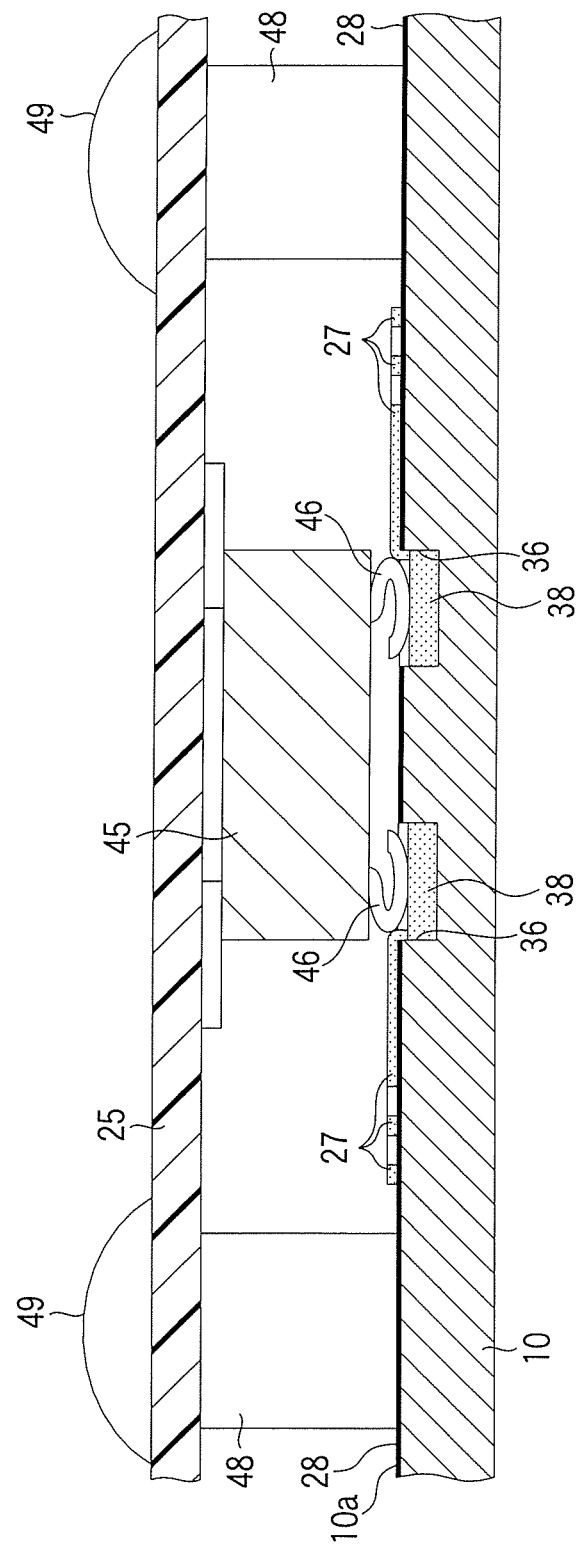
FIG. 10 is an exemplary sectional view of the portable computer of the sixth embodiment taken along line F10-F10 of FIG. 9.

FIG. 9 is an exemplary exploded perspective view showing the internal structure of a portable computer 1 of the sixth embodiment, and FIG. 10 is an exemplary sectional view of the portable computer 1 taken along line F10-F10 of FIG. 9.

As shown in FIG. 9, a plurality of recesses 36 are arranged in an inner surface 10a of a housing 10. As shown in FIG. 10, an electrically conductive adhesive that fills the recesses 36 form a plurality of pad portions 38. Thus, the portable computer 1 is made thinner.

A seventh embodiment will now be described with reference to FIG. 11. Like reference numbers are used to designate those constituent parts which have the same functions as their counterparts in the portable computer 1 of the first embodiment, and a description of those parts is omitted.

FIG. 11 is an exemplary sectional view showing the internal structure of a portable computer 1 of the seventh embodiment. As shown in FIG. 11, a plurality of conductive portions 53 adhere to a plurality of pad portions 38, individually. For example, the conductive portions 53 are metal pieces. Alternatively, however, the conductive portions 53 may be a formed of a metal deposit that covers the pad portions 38.

The conductive portions 53 are harder than the pad portions 38. The conductive portions 53 are interposed individually between the pad portions 38 and terminals 46 of a compression connector 45 so as to contact the terminals 46. Thus, the terminals 46 are electrically connected to the pad portions 38 through the conductive portions 53, individually.

According to the portable computer 1 constructed in this manner, the pad portions 38 are interposed individually between the pad portions 38 and the terminals 46 of the compression connector 45. Thus, the pad portions 38 is prevented from being worn by the terminals 46.

An eighth embodiment will now be described with reference to FIG. 12. Like reference numbers are used to designate those constituent parts which have the same functions as their counterparts in the portable computer 1 of the first embodiment, and a description of those parts is omitted.

FIG. 12 is an exemplary sectional view showing the internal structure of a portable computer 1 of the eighth embodiment. As shown in FIG. 12, a plurality of pad portions 38 comprise concave surfaces 56, individually. The concave surfaces 56 of the pad portions 38 are opposed to their corresponding terminals 46 of the compression connector 45. The terminals 46 are electrically connected to the pad portions 38 by contacting the concave surfaces 56.

According to the portable computer 1 constructed in this manner, the pad portions 38 comprise the concave surfaces 56 in contact with the terminals 46 of the compression connector 45. Thus, wearing of the pad portions 38 by the terminals 46 is suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the electronic component is not limited to a compression connector and may be another component, such as a capacitor. Further, the electronic apparatus is not limited to a portable computer and may be another apparatus, such as a television set, cellphone, etc. Furthermore, the wiring pattern does not always need to be connected to the substrate and USB connector, and may, for example, be electrically connected to another type of connector.

What is claimed is:

1. An electronic apparatus comprising:
   a housing including an outside surface configured to maintain an input device;
   a wiring pattern formed on an inner surface of the housing and made from an electrically conductive adhesive;
   a plurality of projections arranged and formed integrally on the inner surface of the housing, the projections forming a plurality of rows;
   a recess defined by one of the projections and another projection;
   a pad portion formed in the recess from the electrically conductive adhesive, the pad portion thicker than the wiring pattern and connected to an end portion of the wiring pattern;
   a reinforcement portion located between the rows of the projections and adjacent to the pad portion, the reinforcement portion comprising a first rib protruding from the inner surface of the housing and a second rib extending in a direction to cross the first rib, wherein the second rib comprising a plurality of first portions and a plurality of second portions, the first portions extend at right angles to the first rib and the second portions cross the first rib and extend across each other; and an electronic component comprising a terminal configured to press the pad portion.

2. The electronic apparatus of claim 1, further comprising an electrically conductive portion interposed between the pad portion and the terminal of the electronic component and harder than the pad portion.

3. The electronic apparatus of claim 1, wherein the pad portion comprises a concave surface in contact with the terminal of the electronic component.

4. The electronic apparatus of claim 1, wherein thickness of the pad portion is greater than thickness of the wiring pattern, and the pad portion is contained in the recess.

5. An electronic apparatus comprising:
a housing including an outside surface configured to maintain an input device;
a wiring pattern formed on an inner surface of the housing and made from an electrically conductive adhesive;
a plurality of projections arranged and formed integrally on the inner surface of the housing, the projections forming a plurality of rows;
a pad portion formed between the projections from the electrically conductive adhesive and connected to an end portion of the wiring pattern;
a reinforcement portion located between the rows of the projections and adjacent to the pad portion;
a substrate; and
an electronic component mounted on the substrate, the electronic component comprising a terminal configured to press the pad portion,
wherein by a fixation of the substrate with the housing, the terminal of the electronic component is brought into contact with the pad portion.

6. The electronic apparatus of claim 5, wherein the reinforcement portion comprises a first rib protruding from the inner surface of the housing.

7. The electronic apparatus of claim 5, wherein the housing is formed of magnesium alloy.

8. The electronic apparatus of claim 5, wherein the housing is formed of a resin.

9. The electronic apparatus of claim 5, wherein the electrically conductive adhesive is a thermosetting epoxy adhesive containing a silver filler.

10. The electronic apparatus of claim 5, wherein the electrically conductive adhesive is a thermosetting epoxy adhesive containing a copper filler.

11. The electronic apparatus of claim 5, wherein the electrically conductive adhesive is a thermosetting epoxy adhesive containing carbon fibers.

12. The electronic apparatus of claim 6, wherein the reinforcement portion comprises a second rib extending in a direction to cross the first rib.

13. The electronic apparatus of claim 12, further comprising an electrically conductive portion interposed between the pad portion and the terminal of the electronic component and harder than the pad portion.

14. The electronic apparatus of claim 12, wherein the pad portion comprises a concave surface in contact with the terminal of the electronic component.

* * * * *